United States Patent [19]

Morishita et al.

[11] 4,425,554
[45] Jan. 10, 1984

[54] SURFACE ACOUSTIC WAVE RESONATOR DEVICE

[75] Inventors: Shigefumi Morishita; Yasuo Ebata, both of Yokohama, Japan

[73] Assignee: Tokyo Shibaura Denki Kabushiki Kaisha, Kanagawa, Japan

[21] Appl. No.: 318,855

[22] Filed: Nov. 6, 1981

[30] Foreign Application Priority Data

Jan. 19, 1981 [JP] Japan .................................. 56-5166

[51] Int. Cl.³ .......................... H03H 9/25; H03H 9/64
[52] U.S. Cl. ................................ 333/195; 310/313 D; 333/196
[58] Field of Search ................................ 333/193–196, 333/150–155; 310/313 R, 313 A, 313 B, 313 C, 313 D; 29/25.35

[56] References Cited

U.S. PATENT DOCUMENTS 3,886,504  5/1975  Hartmann et al. ................... 333/195
4,130,813 12/1978  Sandy et al. ..................... 333/195 X
4,151,492  4/1979  Sandy et al. ..................... 333/193 X
4,257,021  3/1981  Coussot et al. .................. 333/196 X

FOREIGN PATENT DOCUMENTS 2379941  9/1978  France .

OTHER PUBLICATIONS

Sandy et al., "Surface Acoustic Wave Ring Filter", 1976 Ultrasonics Symposium Proceedings, IEEE Cat. No. 76, CHIIU-5 SU; pp. 391-396.
Schoenwald et al., "Surface Acoustic Wave Resonator Development", Annual Symposium on Frequency Control, May 1975; pp. 150-157.
Takahashi et al., "Saw if Filter on LiTaO₃ for Color TV Receivers", IEEE Transactions on Consumer Electronics, vol. CE-24, No. 3, Aug. 1978; pp. 337-346.

*Primary Examiner*—Marvin L. Nussbaum
*Attorney, Agent, or Firm*—Cushman, Darby & Cushman

[57] ABSTRACT

A surface acoustic wave resonator device including a transducer and grating reflectors having an aperture length, wherein the transducer, which is disposed on a piezoelectric substrate, includes a plurality of interdigital transducers connected to each other in series and aligned to form surface acoustic wave propagation paths parallel to each other, the grating reflectors are disposed on opposite sides of the transducer on the piezoelectric substrate, the aperture length of the grating reflectors extending at least the width of said surface acoustic wave propagation paths and preferably being substantially the same effective length as that of the transducer.

20 Claims, 8 Drawing Figures

SURFACE ACOUSTIC WAVE RESONATOR DEVICE

BACKGROUND OF THE INVENTION

This invention relates to surface acoustic wave resonator devices having grating reflectors, and more particularly to resonator devices used as bandpass filters, oscillator frequency control elements and the like.

There is frequently a requirement in communications and other electronic fields for band pass filters having a narrow frequency range or oscillator frequency control elements. Surface acoustic wave resonator devices may fulfill such a requirement and various surface acoustic wave resonators have been developed.

The surface acoustic wave resonator device includes basically a piezoelectric substrate, at least one interdigital transducer disposed on the piezoelectric substrate for converting an input electric signal to surface acoustic waves propagating on the surface of the piezoelectric substrate, and grating reflectors for reflecting the surface acoustic waves. This kind of surface acoustic wave resonator device is described, for example, in U.S. Pat. Nos. 3,886,504 and 4,166,258.

The impedance of such resonator device must be designed in accordance with the impedance of an external circuit connected thereto. Therefore, a resonator device having high impedance is frequently required as well as a resonator device having low impedance. The optimal impedance of a surface acoustic wave resonator is inversely related to the aperture length of the interdigital transducer as described in a paper entitled "SURFACE ACOUSTIC WAVE RESONATOR DEVELOPMENT" by J. S. Schoenwald et al. presented at *Proc. of the 29th Annual Symp. on Frequency Control*, page 150–157, May 1975. Accordingly, a surface acoustic wave resonator device having high impedance may be obtained by decreasing the aperture length of the interdigital transducer. However, decreasing the aperture length of the interdigital transducer results in reducing the quality factor Q of the resonator device because a beam of the surface acoustic waves propagating on the piezoelectric substrate expands out of the resonance region by diffraction and energy loss increases. Moreover, it is difficult to manufacture such interdigital transducers having a small aperture length.

SUMMARY OF INVENTION

It is an object of this invention to provide a surface acoustic wave resonator device having high impedance as well as a high quality factor.

It is another object of this invention to provide a surface acoustic wave resonator device which can be easily manufactured.

It is still another object of this invention to provide a surface acoustic wave resonator device having different values of input and output impedances.

It is further object of this invention to provide a surface acoustic wave resonator which sufficiently suppresses higher transverse mode waves.

In accordance with the preferred embodiment of this invention the surface acoustic wave resonator device includes at least one transducer and a grating reflector disposed on a substrate having at least layer of piezoelectric material. The transducer includes a plurality of interdigital transducers connected to each other in series and aligned to form surface acoustic wave propagation paths parallel to each other. The grating reflector is disposed on the substrate to reflect the surface acoustic waves generated by the transducer. The aperture length of the grating reflector extends at least the width of the surface acoustic wave propagation paths and preferably is substantially the same effective length as that of the transducer. Such surface acoustic wave resonator device has not only high impedance, but also a high quality factor.

BRIEF DESCRIPTION OF THE DRAWINGS

Other objects and advantages of this invention will become more apparent and more readily appreciated from the following detailed description of the presently preferred exemplary embodiments of the invention taken in conjunction with the accompanying drawings, in which.

DESCRIPTION OF THE PREFERRED EMBODIMENTS

Figure 1:
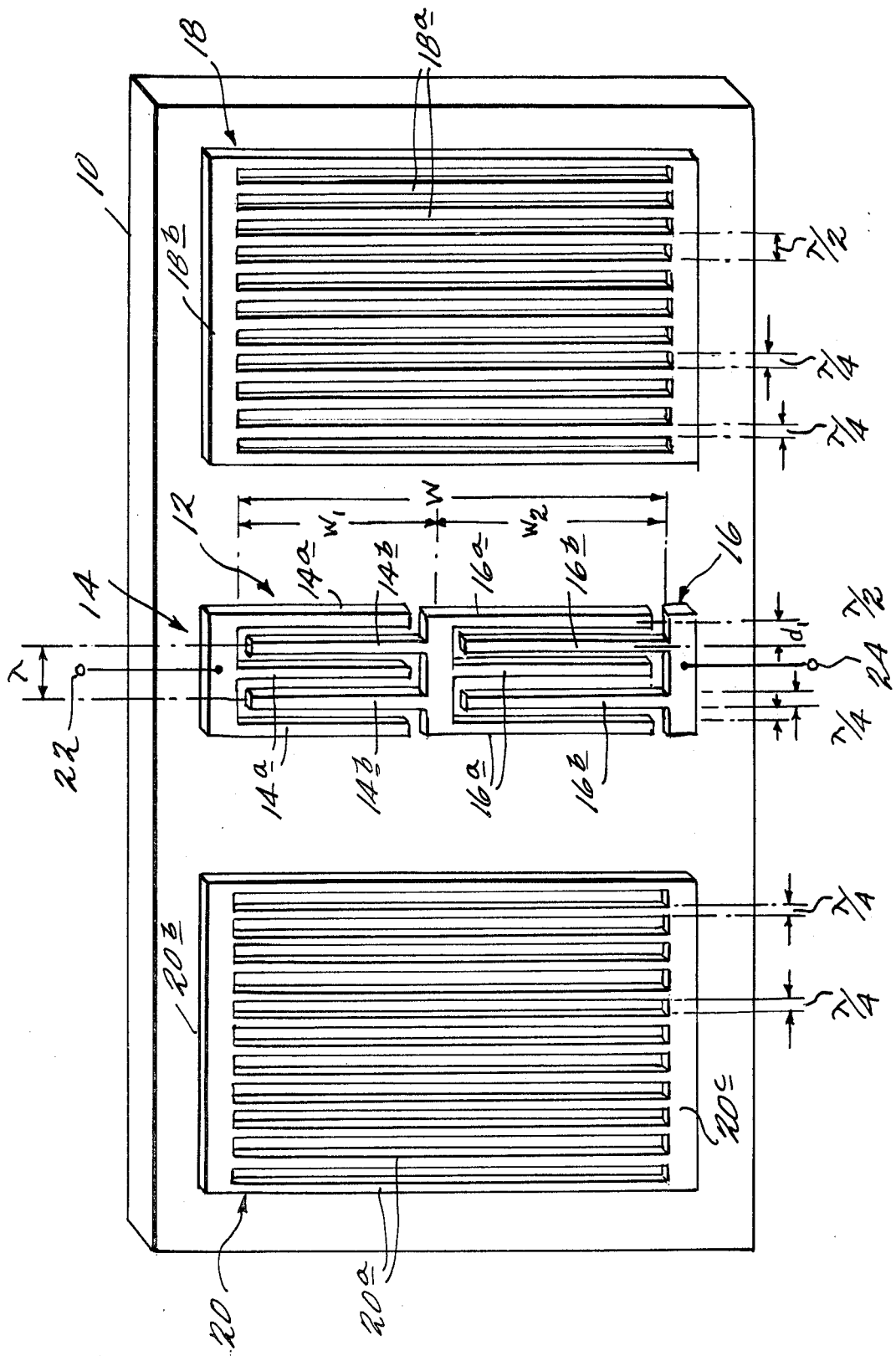
FIG. 1 is a perspective view of one embodiment of a one-port type surface acoustic wave resonator device according to the present invention.

Referring now to FIG. 1, one embodiment of a surface acoustic wave resonator of the present invention, which may obtain an impedance twice that of a conventional surface acoustic wave resonator having a single transducer of aperture length $W_1$, and impedance Z, includes a substrate 10 made of piezoelectric material such as lithium tantalate, lithium niobate or quartz. Positioned on substrate 10 is a transducer 12 which includes first and second interdigital transducers 14 and 16. First interdigital transducer 14 includes a first electrode 14a and a second electrode 14b. These electrodes have many finger electrodes which are arranged in an interdigitated relationship. Also, second transducer 16 includes first and second electrodes 16a and 16b which have many finger electrodes arranged in an interdigitated relationship.

First and second interdigital transducers 14 and 16 are aligned such that the surface acoustic waves generated by first and second interdigital transducers 14 and 16 propagate in the same direction and the phases of these surface acoustic waves correspond to each other correspond to each other. Accordingly, two surface acoustic wave propagation paths parallel to each other are formed.

Second electrode 14b of first interdigital transducer 14 is formed integrally with first electrode 16a of second interdigital transducer 16 and connected thereto electrically. Accordingly, first and second interdigital transducers 14 and 16 are connected to each other in series.

The electrodes 14a, 14b, 16a and 16b may be formed of a suitable patterned thin film electrically conductive material such as aluminum, gold or copper.

These electrodes 14a, 14b, 16a and 16b are illustrated in FIG. 1 as each having three or two fingers, although it should be understood that the electrodes may have a large number of fingers. Each finger has a width which equals $\lambda/4$ and the spacing between adjacent fingers on each electrode is equal to $\lambda$, where $\lambda$ is the wave length of the generated surface acoustic wave. Accordingly, the spacing d between adjacent fingers becomes $\lambda/2$. The aperture length W of transducer 12 is preferably the sum of aperture lengths $W_1$ and $W_2$ ($=W_1$) of first and second interdigital transducers 14 and 16, respectively.

On opposite sides of transducer 12 on piezoelectric substrate 10 a pair of grating reflectors 18 and 20 are positioned. Grating reflector 18 includes parallel spaced reflecting elements 18a which are interconnected at their opposite ends by conductors 18b and 18c. Likewise, grating reflectors 20 includes parallel spaced reflecting elements 20a, and conductors 20b and 20c for interconnecting parallel spaced conductors 20a.

These grating reflectors 18 and 20 may be also formed of thin films such as aluminum, gold, copper, etc. Each parallel spaced reflecting element 18a has a width which equal $\lambda/4$ and the spacing between adjacent reflecting elements is equal to $\lambda/2$. The aperture length of grating reflector 18 is equal to the aperture length W of transducer 12. Grating reflector 20 is formed in a manner similar to grating reflector 18. Grating reflectors 18 and 20 are illustrated in FIG. 1 as having twelve parallel reflecting elements, respectively. It should be understood, however, that they may have a larger number of parallel reflecting elements, for example, usually 200 elements.

In operation an input electrical signal is supplied between a terminal 22 connected to first electrode 14a of first interdigital transducer 14 and a terminal 24 connected to second electrode 16b of second interdigital transducer 16. This input electrical signal is converted by transducer 12 to surface acoustic wave energy propagating along the surface of substrate 10. As these propagating surface waves reach reflecting elements 18a and 20a of grating reflectors 18 and 20, each of which has an aperture length extending over at least the width of the surface acoustic wave propagation path, the waves will be at least partially reflected by each of the reflecting elements 18a and 20a. The individual reflecting elements 18a and 20a of each of grating reflectors 18 and 20 are equispaced with the distance between centers of adjacent reflecting elements being equal to one-half wave length at the center frequency of the resonator device. As a result, the waves reflected from reflecting elements 18a and 20a of grating reflectors 18 and 20 will reinforce in coherent manner. If a suitable number of reflective reflecting elements are provided, almost total reflection of the incident acoustic waveform will occur. The presence of two grating reflectors 18 and 20 on the surface of substrate 10 results in a standing wave resonance being set up between two reflectors 18 and 20. Proper realization of this standing wave resonance requires that two grating reflectors 18 and 20 are separated by approximately an integral number of half-wave lengths along the surface of substrate 10.

The impedance of the surface acoustic wave resonator device having the grating reflectors is inversely related to the aperture length of the transducer. Accordingly, if it is wished that a surface acoustic wave resonator device has an impedance twice as much as impedance Z of the conventional surface acoustic wave resonator device having an aperture length $W_1$, the device having the aperture length $W_1/2$ was designed in the prior art. However, it resulted in the reduction of Q of the resonator device.

In accordance with the resonator device of the present invention, first and second interdigital transducers 14 and 16 each having the aperture lengths $W_1$ are designed. Therefore, the impedances of first and second interdigital transducers 14 and 16 are Z, respectively. However, first and second interdigital transducers are connected in series. Accordingly, the total impedance of the resonator device is 2Z. Moreover, the total aperture length of transducer 12 is $2W_1$. As a result, this invention is the surface acoustic wave resonator device having not only high impedance but also a high quality factor Q.

Figure 2:
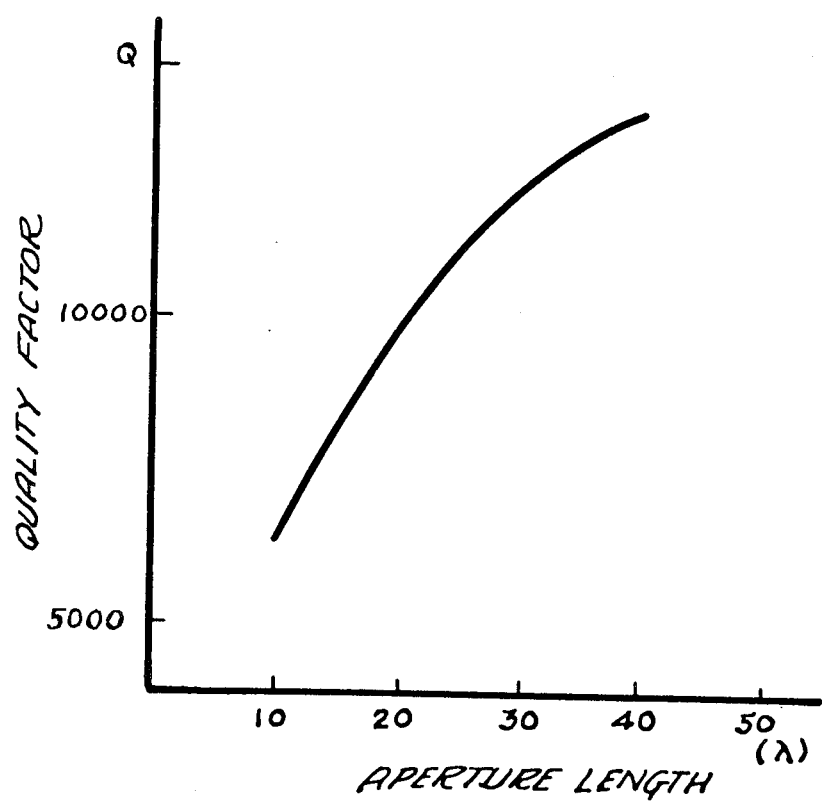
FIG. 2 is a graphical illustration of the aperture length of a surface acoustic wave resonator device versus its quality factor.

FIG. 2 is a graph showing the relationship between the aperture length $W_1$ and quality factor of a conventional resonator device which includes a transducer having 11 pairs of fingers and grating reflectors having 200 reflecting elements, respectively, on a lithium tantalate ($LiTaO_3$) substrate. In FIG. 2, when the aperture length $W_1$ is $20\lambda$, the quality factor Q is about 9700.

If a resonator device having an impedance twice as much the as above mentioned resonator device is wished, the aperture length of the resonator device must be $10\lambda$ in the manner of the prior art. However, the quality factor of such resonator device is reduced to about 6500.

The resonator device of the present invention may have the aperture length $40\lambda$ and still have an impedance twice as much as above mentioned resonator device. Accordingly, the quality factor of the resonator device according to the present invention increases to about 13,000.

As an alternative to the resonator device including interdigital transducers connected in series as shown in FIG. 1, a resonator device including more than three transducers connected in a series may be provided. Such resonator device may have higher impedance and quality factor.

Figure 3:
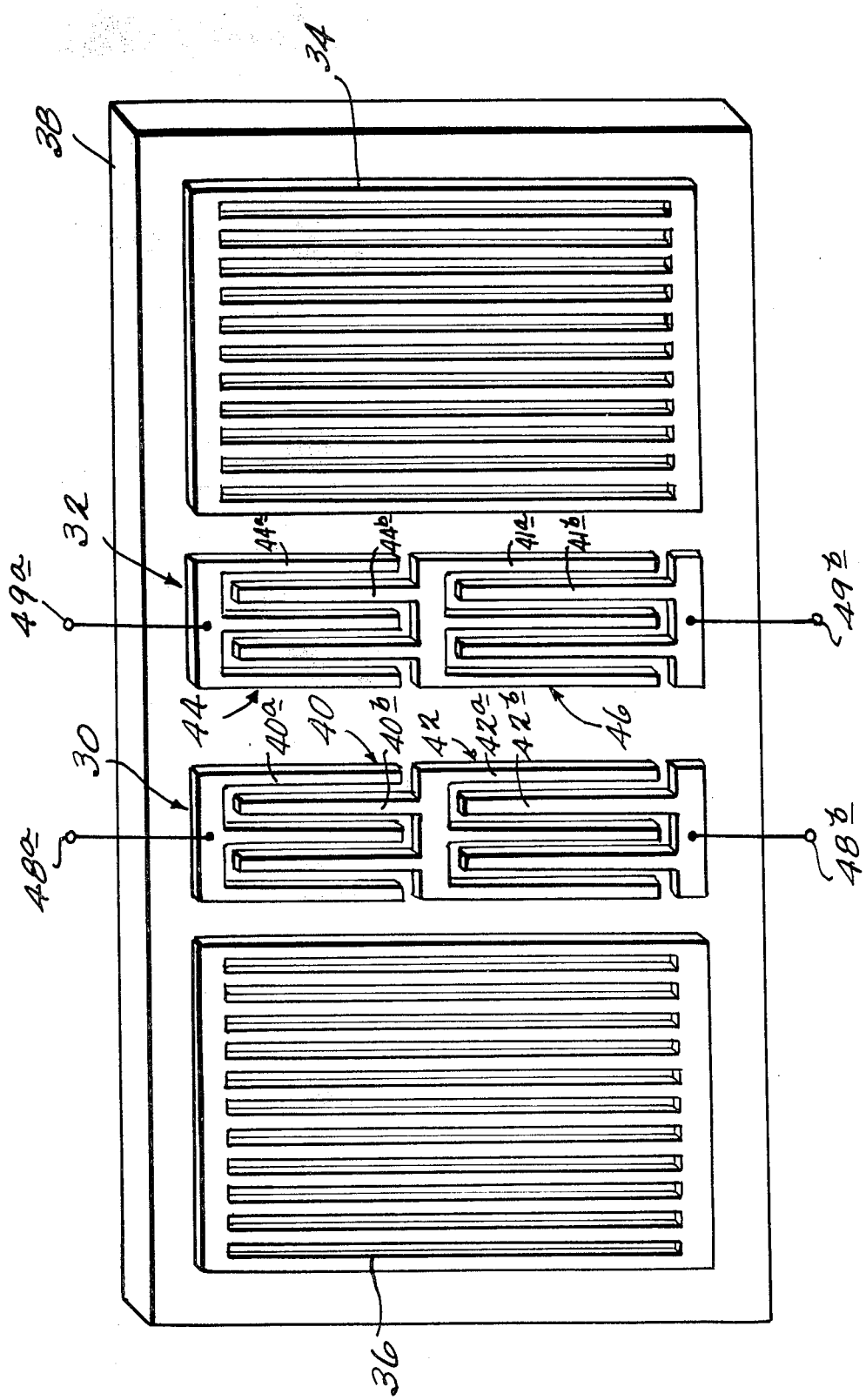
FIG. 3 is a perspective view of one embodiment of a two-port type surface acoustic wave resonator device in accordance with the present invention.

FIG. 3 illustrates an embodiment of the present invention utilized in a two-port surface acoustic wave resonator device. This resonator device is similar to that illustrated in FIG. 1 except that input and output transducers 30 and 32 are disposed on the substrate 38 in the space between the grating reflectors 34 and 36. Input and output transducers 30 and 32 each have the same configurations as the transducer 12 shown in FIG. 1 and are positioned in a face to face relationship. Input transducer 30 includes first and second interdigital transducers 40 and 42 which each have first and second electrodes 40a, 40b, 42a and 42b. Second electrode 40a of first interdigital transducer 40 is formed integrally with first electrode 42a of second interdigital transducer 42 and connected electrically thereto.

Similarly, output transducer 32 includes first and second interdigital transducers 44 and 46 which each have first and second electrodes 44a, 44b, 46a and 46b.

An input electric signal is supplied between a terminal 48a connected to first electrode 40a of first interdigital transducer 40 and a terminal 48b connected to second electrode 42b of second interdigital transducer 42. Energy in the standing wave resonance is coupled by means of output interdigital transducer 32 to a load (not shown) connected between first electrode 44a of first interdigital transducer 44 and second electrode 46a of second interdigital transducer 46 through terminals 49a and 49b.

Figure 4:
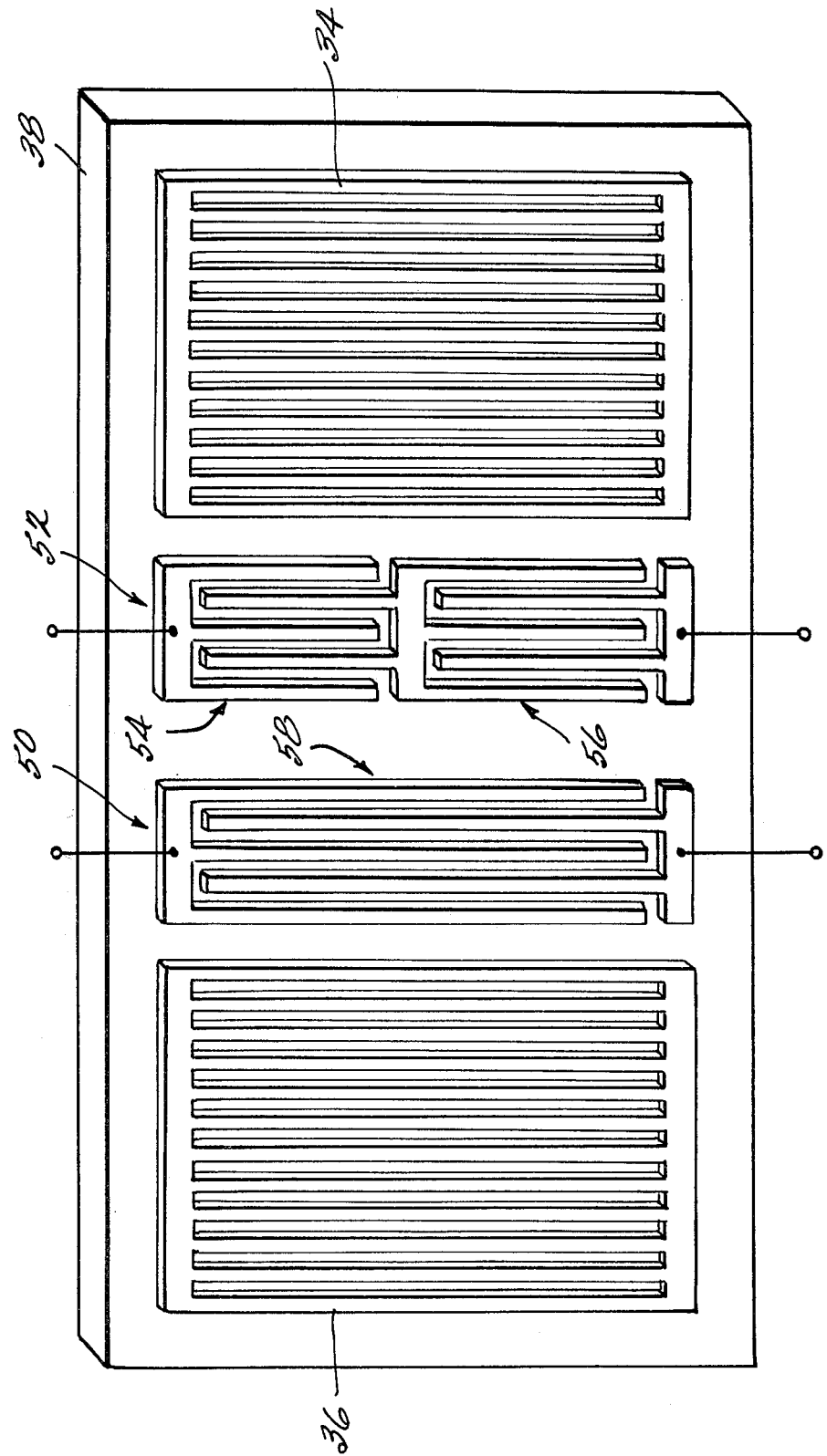
FIG. 4 is a perspective view of another embodiment of the two-port type surface acoustic wave resonator device in accordance with the present invention.

FIG. 4 illustrates another embodiment of the present invention utilized in the two-port surface acoustic wave resonator device. The resonator device of this embodiment has input and output transducers 50 and 52, the configurations of which are different. Output transducer 52 includes two interdigital transducers 54 and 56 connected in series. These interdigital transducers 54 and 56 each have aperture lengths W/2. Input transducer 50 includes only single interdigital transducer 58 having an aperture length w.

Such resonator device has an input impedance different from its output impedance. If the input impedance is denoted by Z and the output impedance is 4Z. As described above, input and output impedances of this resonator device may be designed individually. Accordingly, the impedance matchings between input transducer 50 and an external circuit to be coupled thereto, and between output transducer 52 and an external circuit to be coupled thereto may be carried out individually.

As alternative to the embodiment shown in FIG. 4, input and output transducers each may have an arbitrary number of interdigital transducers to be connected in series to obtain desired impedances.

Figure 5:
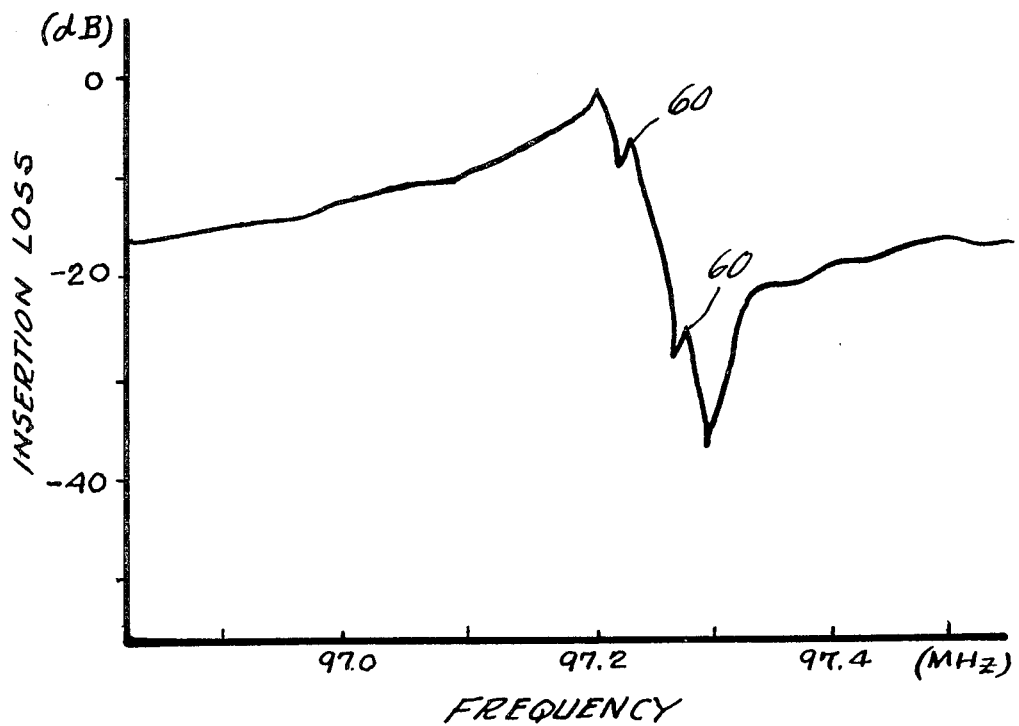
FIG. 5 is a graphical illustration of the insertion loss versus frequency characteristic of a prior art surface acoustic wave resonator device.
Figure 6:
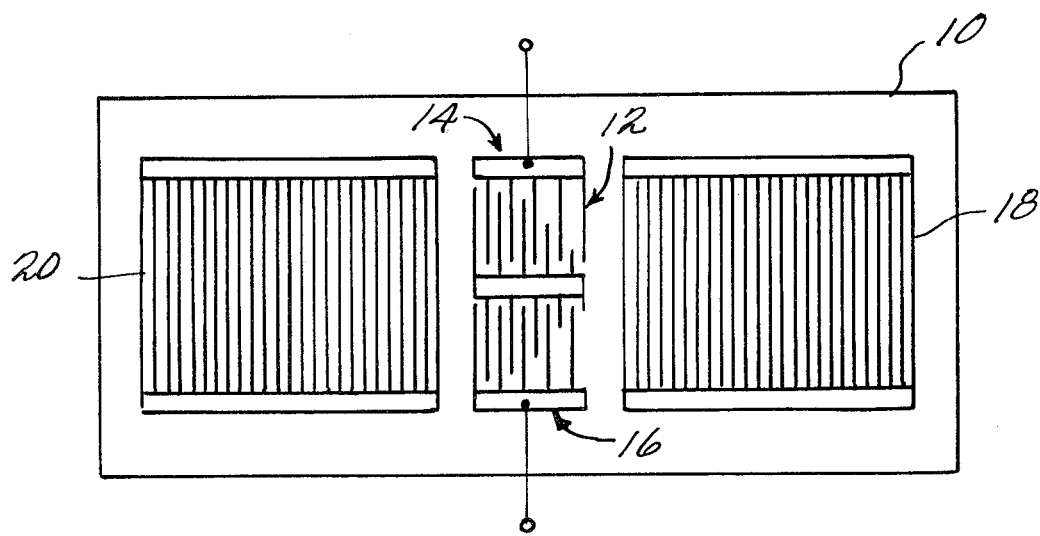
FIG. 6 is a plane view of another embodiment of the one-port type surface acoustic wave resonator device in accordance with the present invention.

It is known that the surface acoustic waves generated by the transducer contain not only the fundamental mode wave but also higher transverse mode waves. The higher transverse mode waves cause spurious responses in the frequency characteristic of a surface acoustic wave resonator device as shown in FIG. 5. The resonance frequency of the higher transverse mode waves varys in response to the aperture length of the grating reflectors. When the aperture length of the grating reflectors is long, there appear resonance points (spurious) shown in FIG. 5 at 60. This disadvantage can be overcome by the further embodiment of this invention shown in FIG. 6.

The surface acoustic resonator device of this embodiment is similar to that illustrated in FIG. 1 except that finger electrodes of a transducer have their overlapped portions varied in width along a weighted pattern. This variation in overlap along the transducer has been termed "apodization," and the resultant structures are called "apodized interdigitated transducers." However, the transducer of this embodiment has two interdigital transducers connected in series which form a single apodized interdigitated transducer. The weighted pattern is designed so that the energy distribution of the surface acoustic wave generated by the interdigital transducer is the same as that of the fundamental traverse mode wave. For example, the weighted pattern is developed according to the cos X in the direction perpendicular to the acoustic wave propagation direction.

Figure 7:
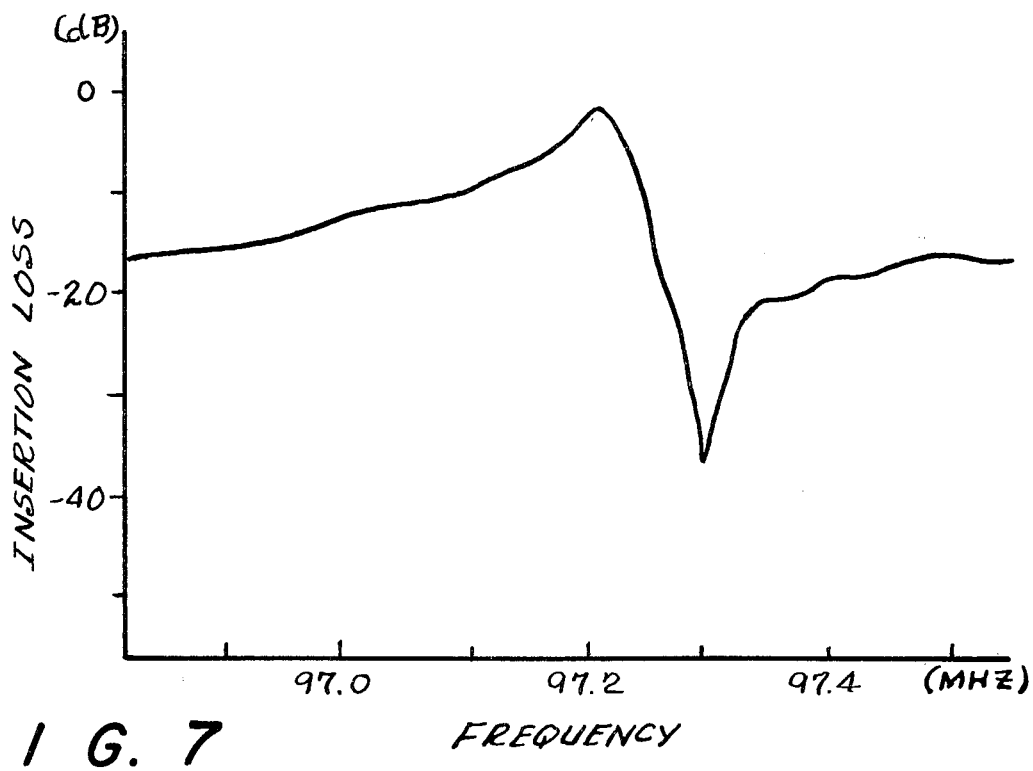
FIG. 7 is a graphical illustration of the insertion loss versus frequency characteristic of the device illustrated in FIG. 6.

Accordingly, the interdigital transducer doesn't generate the higher transverse mode waves, but generates the fundamental traverse mode wave. As a result, spurious results from higher transverse mode waves is reduced as shown in FIG. 7.

Figure 8:
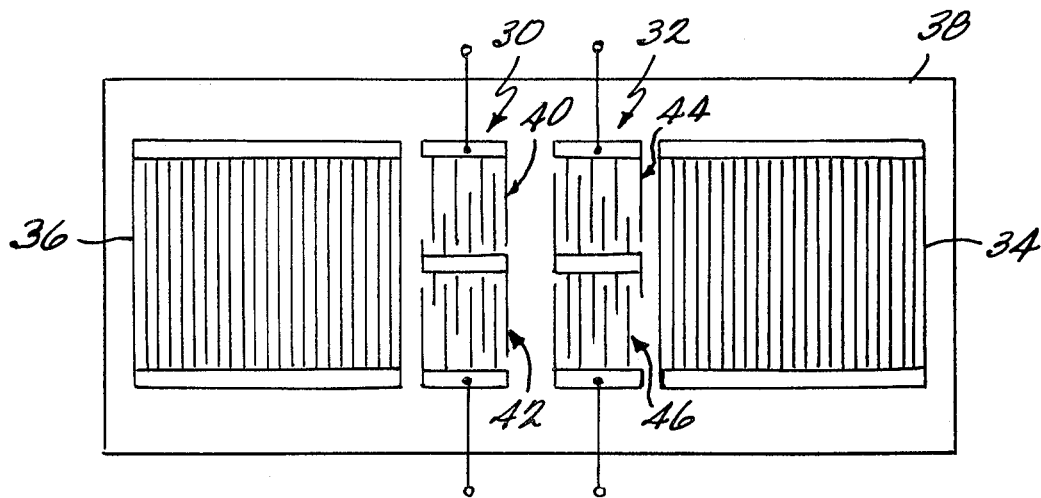
FIG. 8 is a plane view of further embodiment of the two-port type surface acoustic wave resonator device in accordance with the present invention.

Such an apodized interdigital transducer may be applied to input and output transducers 30 and 32 of the two-port surface acoustic wave resonator device as shown in FIG. 8.

In the above embodiments, substrates made entirely of piezoelectric material can be used; alternatively, substrates covered with piezoelectric film can also be used.

The piezoelectric material is preferably lithium tantalate ($LiTaO_3$), and transducers and grating reflectors preferably made of aluminum (Al) are formed on the $LiTaO_3$ substrate to obtain excellent resonance characteristics.

Further, grating reflectors are preferably made of Al and a small amount of at least either copper or silicon to prevent damage originating from stress by surface acoustic waves.

While the invention has been described in connection with what is presently considered to be the most practical and preferred embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures.

What is claimed is:

1. A surface acoustic wave resonator device comprising:
    a substrate having at least a layer of piezoelectric material;
    at least one transducer means disposed on the surface of said piezoelectric layer for converting an input electrical signal to surface acoustic waves propagating on said piezoelectric surface of the substrate, said transducer comprising a plurality of interdigital transducers electrically connected to each other in series between terminals to which the input electrical signal is applied and aligned to form surface acoustic wave propagation paths parallel to each other, and said interdigital transducers each having first and second electrodes with finger electrodes arranged in an interdigitated relationship; and
    grating reflector means having an aperture length and disposed on said piezoelectric surface for reflecting the surface acoustic waves, said reflector means including a plurality of parallel spaced reflecting elements arranged in parallel to said finger electrodes of said interdigital transducers and a spacing between adjacent reflecting elements is equal to a spacing between adjacent finger electrodes of said interdigital transducers, and said aperture length of said grating reflector means extending at least the width of said surface acoustic wave propagation paths.

2. A surface acoustic wave resonator device according to claim 1, wherein said transducer means comprises first and second interdigital transducers, the second electrode of said first interdigital transducer being formed integrally with the first electrode of said second interdigital transducer.

3. A surface acoustic wave resonator device according to claim 2, wherein said input electric signal is applied between said first electrode of the first interdigital transducer and said second electrode of the second interdigital transducer.

4. A surface acoustic wave resonator device according to claim 1, wherein said piezoelectric material of the substrate is lithium tantalate (LiTaO$_3$), and said transducer means and grating reflector means each are made of aluminum.

5. A surface acoustic wave resonator device according to claim 1 or 4, wherein said substrate comprises a substrate made entirely of piezoelectric material.

6. A surface acoustic wave resonator device according to claim 1, wherein said reflecting elements are conductors.

7. A surface acoustic wave resonator device according to claim 1, wherein said grating reflector means comprises first and second grating reflectors disposed on opposite sides of said transducer.

8. A surface acoustic wave resonator device according to claim 6, wherein said conductors are interconnected along common ends of each conductor.

9. A surface acoustic wave resonator device according to claim 6, wherein said conductors each comprises aluminum and a small amount of at least either copper or silicon.

10. A surface acoustic wave resonator device according to claim 1, wherein said aperture length of said grating reflector means is substantially the same effective length as the total aperture length of said interdigital transducers.

11. A surface acoustic wave resonator device comprising:
a piezoelectric substrate;
an input transducer disposed on said piezoelectric substrate for converting an input electrical signal to surface acoustic waves propagating on said piezoelectric substrate;
an output transducer disposed on said piezoelectric substrate in a face to face relationship with said input transducer for converting the surface acoustic waves to an electric signal, at least one of said transducers comprising a plurality of interdigital transducers which are connected to each other in series between a pair of signal terminals and aligned in a direction perpendicular to the surface acoustic wave propagation path; and
first and second grating reflectors, disposed on said piezoelectric substrate with said input and output transducers therebetween, for reflecting the surface acoustic waves, the aperture length of said first and second grating reflectors extending at least the width of said surface acoustic wave propagation paths.

12. A surface acoustic wave resonator device according to claim 11, wherein said input and output transducers comprise an equal number of interdigital transducers.

13. A surface acoustic wave resonator device according to claim 11, wherein said input and output transducers comprise a different number of interdigital transducers.

14. A surface acoustic wave resonator device according to claim 11, wherein one of said transducers comprises a plurality of interdigital transducers.

15. A surface acoustic wave resonator device according to claim 11, wherein said aperture length of said grating reflector means is substantially the same effective length as the total aperture length of said interdigital transducers.

16. A surface acoustic wave resonator device according to claim 11 wherein said input and output transducers are interdigital transducers each comprising a plurality of substantially parallel spaced-apart conductive electrodes arranged in an interdigitiated relationship, the traverse overlap between adjacent electrodes varying along the surface acoustic wave propagation direction.

17. A surface acoustic wave resonator device according to claim 16, wherein said traverse overlap between adjacent electrodes varies according to the characteristic cos X.

18. A surface acoustic wave resonator device comprising:
a piezoelectric substrate capable of supporting propagating surface acoustic wave energy;
a plurality of interdigital transducers coupled to a surface of said substrate and connected to each other in series and aligned to form surface acoustic wave propagation paths parallel to each other, and said interdigital transducer each comprising a plurality of substantially parallel spaced-apart conductive electrodes arranged in an interdigitated relationship, the traverse overlap between adjacent electrodes varying along the surface acoustic wave propagation direction; and
grating reflector means having an aperture length and disposed on said piezoelectric substrate for reflecting the surface acoustic waves, said aperture length of said grating reflector means having substantially the same effective length as total aperture length of said interdigital transducer.

19. A surface acoustic wave resonator device according to claim 18, wherein said variation in overlap between adjacent electrodes indicates the characteristic of cos X.

20. A surface acoustic wave resonator device according to claim 18, wherein said transducer means comprises an input transducer for converting an electric signal to surface acoustic waves, and an output transducer for converting said surface acoustic waves to the electric signal.

* * * * *